United States Patent
Ly-Gagnon et al.

(10) Patent No.: US 9,685,213 B2
(45) Date of Patent: Jun. 20, 2017

(54) PROVISION OF HOLDING CURRENT IN NON-VOLATILE RANDOM ACCESS MEMORY

(71) Applicant: Intel Corporation, Santa Clara, CA (US)

(72) Inventors: Dany-Sebastien Ly-Gagnon, Santa Clara, CA (US); Kiran Pangal, Fremont, CA (US); Raymond W. Zeng, Sunnyvale, CA (US); Mase J. Taub, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/347,736

(22) Filed: Nov. 9, 2016

(65) Prior Publication Data

US 2017/0053698 A1 Feb. 23, 2017

Related U.S. Application Data

(62) Division of application No. 14/742,316, filed on Jun. 17, 2015, now Pat. No. 9,543,004.

(51) Int. Cl.
*G11C 11/00* (2006.01)
*G11C 13/00* (2006.01)
*H01L 29/06* (2006.01)

(52) U.S. Cl.
CPC .......... *G11C 11/00* (2013.01); *G11C 13/0004* (2013.01); *G11C 13/0038* (2013.01);
(Continued)

(58) Field of Classification Search
CPC . G11C 11/00; G11C 13/0097; G11C 13/0069; G11C 13/0038; G11C 13/0004
See application file for complete search history.

(56) References Cited

U.S. PATENT DOCUMENTS 6,687,153 B2 2/2004 Lowrey
9,336,876 B1 5/2016 Kumar et al.
(Continued)

OTHER PUBLICATIONS

International Search Report and Written Opinion mailed Aug. 22, 2016, issued in corresponding International Application No. PCT/US2016/032139, 10 pages.
(Continued)

*Primary Examiner* — Harry W Byrne
*Assistant Examiner* — Ajay Ojha
(74) *Attorney, Agent, or Firm* — Schwabe, Williamson & Wyatt, P.C.

(57) ABSTRACT

Embodiments of the present disclosure describe techniques and configurations for controlling current in a non-volatile random access memory (NVRAM) device. In an embodiment, the NVRAM device may include a plurality of memory cells coupled to a plurality of bit lines forming a bit line node with parasitic capacitance. Each memory cell may comprise a switch device with a required level of a holding current to maintain an on-state of the cell. A voltage supply circuitry and a controller may be coupled with the NVRAM device. The controller may control the circuitry to provide a current pulse that keeps a memory cell in on-state. The pulse may comprise a profile that changes over time from a set point to the holding current level, in response to a discharge of the bit line node capacitance through the memory cell after the set point is achieved. Other embodiments may be described and/or claimed.

15 Claims, 8 Drawing Sheets

(52) U.S. Cl.
CPC ...... *G11C 13/0069* (2013.01); *G11C 13/0097* (2013.01); *H01L 29/06* (2013.01)

(56) References Cited

U.S. PATENT DOCUMENTS

| | | |
|---|---|---|
| 2006/0227591 A1 | 10/2006 | Lowrey et al. |
| 2007/0019465 A1 | 1/2007 | Bedeschi et al. |
| 2009/0196092 A1 | 8/2009 | Jagasivamani |
| 2010/0157666 A1 | 6/2010 | Parkinson |
| 2010/0182826 A1 | 7/2010 | Czubatyj |
| 2010/0284211 A1 | 11/2010 | Hennessey |
| 2011/0134685 A1 | 6/2011 | Kau et al. |
| 2014/0036583 A1 | 2/2014 | Pellizzer et al. |
| 2016/0080439 A1 | 3/2016 | Bhathena et al. |

OTHER PUBLICATIONS

Non-Final Office Action mailed May 26, 2016, issued in corresponding U.S Appl. No. 14/742,316.
Notice of Allowance mailed Sep. 2, 2016, issued in corresponding U.S Appl. No. 14/742,316.

PROVISION OF HOLDING CURRENT IN NON-VOLATILE RANDOM ACCESS MEMORY

CROSS-REFERENCE TO RELATED APPLICATION

This application is a division of U.S. application Ser. No. 14/742,316 filed Jun. 17, 2015, and entitled "PROVISION OF HOLDING CURRENT IN NON-VOLATILE RANDOM ACCESS MEMORY," the disclosure of which is hereby incorporated by reference herein in its entirety for all purposes.

FIELD

Embodiments of the present disclosure generally relate to the field of integrated circuits, and more particularly, to a provision of holding current in non-volatile random access memory (NVRAM) devices, such as phase change memory devices.

BACKGROUND

Phase change memory (PCM) technology such as multi-stack cross-point PCM is a promising alternative to other non-volatile (NV) memory technology, commonly known as non-volatile random access memory (NVRAM). In PCM memory cells, the threshold voltage window is defined as the difference between the set state threshold voltage (referred to as the SET VT) and reset state threshold voltage (referred to as the RESET VT) of the memory cell. It is desirable to have the threshold voltage window as large as possible. This may be accomplished by either lowering the SET VT or increasing the RESET VT.

PCM memory cells use a switch device, with a minimal on-state holding current (referred to as the holding current) that may be required to sustain the memory cell's on-state. Current passing through the memory cell may determine the level of SET VT. Providing a SET VT as low as possible may increase the threshold voltage window. In order to provide a SET VT as as low possible, a current passing through a memory cell at or near the holding current may be desired.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
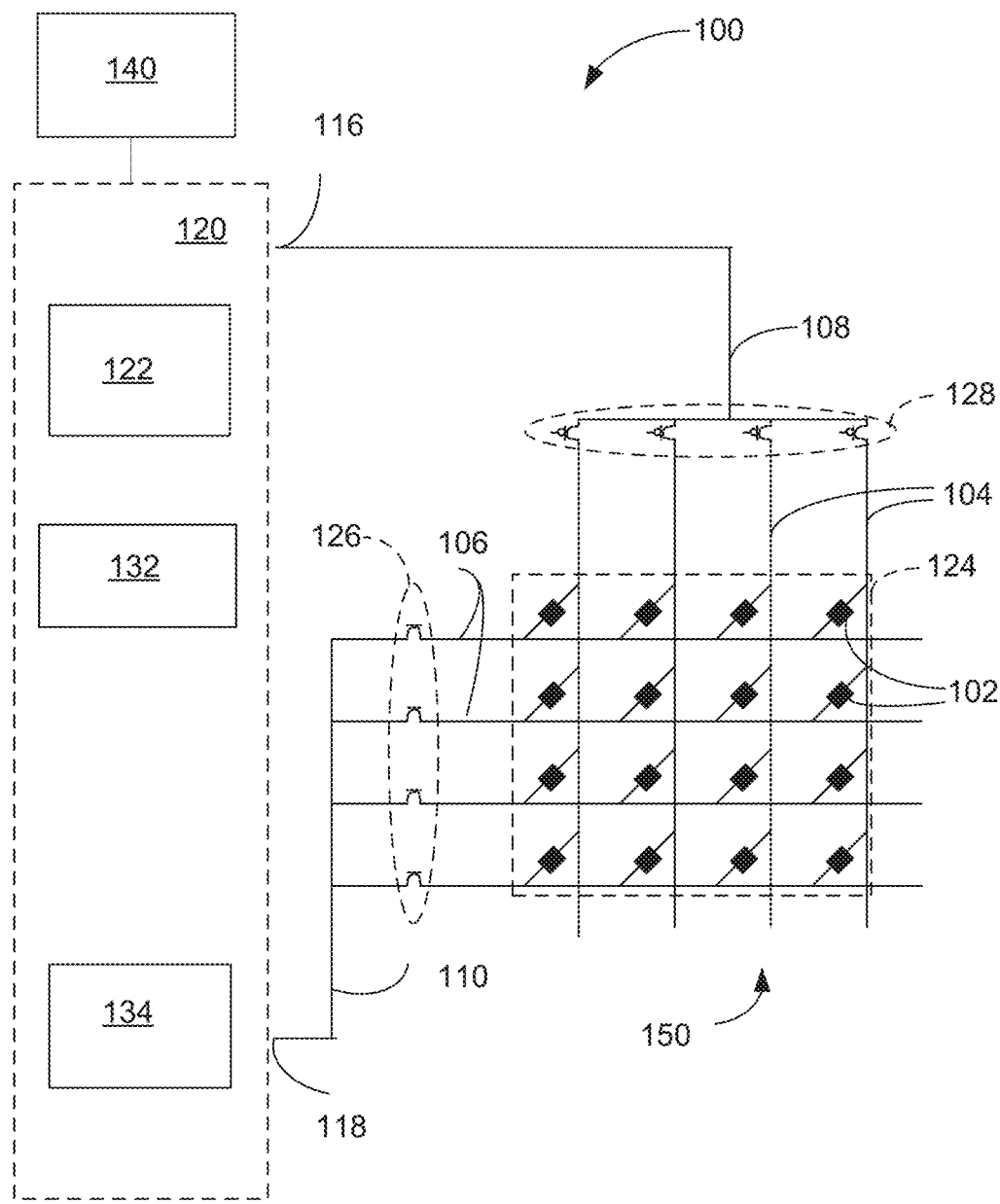
FIG. 1 is an example apparatus comprising an NVRAM device, such as PCM, device having the holding current provision technology of the present disclosure, in accordance with some embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Techniques for controlling current in an NVRAM device, such as PCM device, are discussed herein. In one instance, the apparatus may comprise an NVRAM device including a plurality of memory cells coupled to a plurality of bit lines forming a bit line node with parasitic capacitance. Each memory cell may comprise a switch device with a required level of a holding current to maintain an on-state of the memory cell. The NVRAM device may further include a voltage supply circuitry coupled with the NVRAM device and a controller coupled with the voltage supply circuitry. The controller may control the circuitry to provide a current pulse that keeps a memory cell in an on-state. The current pulse may comprise a profile that changes over time from a set point to the holding current level, in response to a discharge of the bit line node parasitic capacitance through the memory cell after the set point is achieved.

In another instance, the apparatus may comprise an NVRAM device including a plurality of memory cells coupled to a plurality of word lines forming a word line node with parasitic capacitance. Each memory cell may comprise a switch device with a required level of a holding current to maintain an on-state of the memory cell. The NVRAM device may further include a voltage supply circuitry coupled with the NVRAM device and a controller coupled with the voltage supply circuitry. The controller may control the circuitry to provide a current pulse that keeps a memory cell in an on-state. The current pulse may comprise a profile that changes over time from a set point to the holding current level, in response to a discharge of the word line node parasitic capacitance through the memory cell after the set point is achieved.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), (A, B or C) or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

FIG. 1 is an example apparatus 100 comprising an NVRAM device, such as PCM device, having the holding current provision technology of the present disclosure, in accordance with some embodiments. According to various embodiments, the apparatus 100 may include one or more memory cells (hereinafter "memory cells 102"), which may be configured in an array as shown. The memory cells 102 may include, for example, a phase change material such as a chalcogenide glass that can be switched between crystalline and amorphous states with the application of heat produced by an electric current. The state (e.g., crystalline/amorphous) of the phase change material may correspond with a logical value (e.g., 0, 1, 00, 01, 10, 11 and so forth) of the memory cells 102. The apparatus 100 may be part of a phase change memory and switch (PCMS) device in some embodiments. The memory cells 102 may include a switch such as, for example, an ovonic threshold switch (OTS) configured for use in selection/programming operations of the memory cells 102. In other embodiments, the apparatus 100 may be part of other suitable types of memory devices. Regardless, as will be described in more detail below, the apparatus 100 may be incorporated with the reset current delivery technology of the present disclosure to facilitate delivery of a set current pulse to the memory cells.

The apparatus 100 may further include one or more bit lines (hereinafter "bit lines 104") and one or more word lines (hereinafter "word lines 106") coupled to the memory cells 102, as can be seen. The bit lines 104 and word lines 106 may be configured such that each of the memory cells 102 is disposed at an intersection of each individual bit line and word line.

The apparatus 100 may further include a voltage supply circuitry 120 coupled with the memory cells 102 and configured to provide and control voltage supply of the apparatus 100. For example, the voltage supply circuitry 120 may be configured to apply voltage or bias to a target memory cell of the memory cells 102 using the word lines 106 and the bit lines 104 to select the target cell for a read or write operation. Bit line drivers 128 may be coupled to the bit lines 104 and word line drivers 126 may be coupled to the word lines 106 to facilitate decoding/selection of the one or more memory cells 102. According to embodiments described herein, the controller 140 may control the circuitry 120 to provide a current pulse that may keep a memory cell in an on-state. The current pulse may comprise a profile that changes over time from a set point to the holding current level, in response to a discharge of the bit line node parasitic capacitance through the memory cell after the set point is achieved.

In embodiments, the cells 102, word line 106 and bit lines 106 may be organized to form a cross-point memory array 150. For example, the apparatus 100 may include one or more tiles 124. The one or more tiles 124 may comprise a portion of the array of one or more word lines 106, bit lines 104, and memory cells 102 that is treated as a discrete unit during a selection operation of a target memory cell. That is, in some embodiments, each of the one or more tiles 124 is a unit of the array that is biased to select the target memory cell (e.g., a bit, a pair of bits, and so forth) in the array. In the depicted embodiment, the one or more tiles 124 comprise an array of four word lines and four bit lines (4 WL×4 BL); however, other tile sizes can be used in other embodiments including, for example, a tile size of one thousand word lines by one thousand bit lines (1000 WL×1000 BL). The one or more tiles 124 may be part of any memory layer of a stacked memory configuration in some embodiments. For example, the one or more tiles 124 may be part of a memory layer formed on another memory layer, in some embodiments.

The bit lines 104 may be coupled to a bit line electrode (global bit line) 108, which may be further coupled to the voltage supply circuitry 120 at a bit line node 116. Voltage supply circuitry 120 may include, for example, a bit line supply 132 that may be configured to provide an electrical supply for the bit lines 104.

The word lines 106 may be coupled to a word line electrode (global word line) 110, which may be further coupled to the voltage supply circuitry 120 at a word line node 118. Voltage supply circuitry 120 may include, for example, a word line voltage supply 134 that may be configured to provide an electrical supply (e.g., voltage HNVNN) for the word lines 106. The bit line electrode 108 and the word line electrode 110 may each be a current path to the memory cells 102. The word line drivers 126 and the bit line drivers 128 may each comprise single or multiple transistors per electrode according to various embodiments.

In an embodiment, the voltage supply circuitry 120 may include components 122 configured to provide different functionalities to the apparatus 100. Components 122 may include, for example, sensing circuitry coupled to the bit line electrode 108. The sensing circuitry may use the bit line electrode 108 as an electrical node for performing a read operation, such as a sense operation, of the memory cells 102. Components 122 may further include write circuitry (not shown) coupled to the bit line electrode 108. The write circuitry may use the bit line electrode 108 as an electrical node for performing a write operation, such as a set or reset operation, of the memory cells 102.

Components 122 may include a selection module coupled to the word line electrode 110, to facilitate a selection operation of the memory cells 102 using the word line electrode 110. The selection operation may precede a read or write operation and place the target memory cell of the memory cells 102 in a state to receive a read or write operation. During selection, a target memory cell may be moved from a subthreshold region of operation to a region of operation above a threshold region of operation by applying a voltage bias across the target memory cell of the memory cells 102. The voltage bias to achieve selection of the target cell may be provided by circuitry 120 via word line and bit line drivers 126 and 128 for the respective target word line and bit line.

In embodiments, the target word line bias and the target bit line bias may be controlled such that, in combination, an overall bias is applied across the target cell that is sufficient to bring the target memory cell above a threshold voltage and turn the memory cell on, e.g., enable the memory cell to conduct current during a set operation of the memory cell. The set operation may be aimed to bring the memory cell to a set state, in which the phase change material of the memory cell may be in crystalline state, providing for low resistance of the memory cell.

In some embodiments, the features of the circuitry 120 may be suitably combined in one or more modules or may be coupled with the other of the bit line electrode 108 and/or word line electrode 110 than depicted. The apparatus 100 may be configured to perform actions of methods described herein, according to various embodiments. For example, the apparatus 100 may be coupled with one or more control modules configured to perform select and/or set operations of a memory cell, according to embodiments described herein.

For purposes of explanation, the apparatus 100 is shown in FIG. 1 as including a controller 140 coupled to the voltage supply circuitry 120 and configured to control current provided by the voltage supply circuitry 120 to the memory cells 102. The operation of the controller 140 to control voltage supply circuitry 120 to provide a current pulse to a memory cell during a set operation in accordance with embodiments described herein will be explained in reference to FIG. 2, in view of the foregoing discussion.

As discussed above, a memory cell may include a switch device, with a minimal on-state holding current (a turn-off point) that may be required to sustain the memory cell's on-state. The phase change material of the memory cell may be responsible to ensure a difference in VT levels for SET and RESET states of the memory cell. When the phase change material is crystalline (in a SET VT state), it is at a lower VT than when the phase change material is amorphous (in a RESET VT state). The switch device may select the cell when enough voltage is applied across the cell. Crystallization currents may be near the holding current. If the memory cell receives a current that is at or about the crystallization current level, the memory cell may at least partially crystallize and the cell VT may move towards the SET VT level.

If the current to the memory cell is below the crystallization current level, the current may have no effect on the memory cell. Generally, the crystallization current is a function of the material composition and the thermal profile of the memory cell. The holding current may be a function of the material parameters of the switch device of the memory cell and the parasitic circuit dynamics surrounding the memory cell. Variations in process manufacturing may lead to variations in the cell crystallization and holding currents. The embodiments described herein provide a current sweep passing through a target memory cell from a predetermined set point down to the lowest current that the memory cell can support, e.g. the holding current of the cell. A controlled ramp-down current sweep (set current pulse) through the memory cell may ensure that the crystallization current (or near-crystallization current) is applied to the memory cell, to prevent the memory cell from re-thresholding during a set operation. As described below in greater detail, to provide for the crystallization current or near-crystallization current flowing through the memory cell, the bit line node may be "floated", e.g., supply voltage may be disconnected from the bit line node after a certain voltage level at the node has been achieved. After the bit line voltage is floated, the memory cell may still be in amorphous state, and a portion of the current pulse may crystallize the memory cell. In this case, the memory cell may not re-threshold and as such, if it became crystallized after floating of the bit line node, it may not return to an amorphous state.

Figure 2:
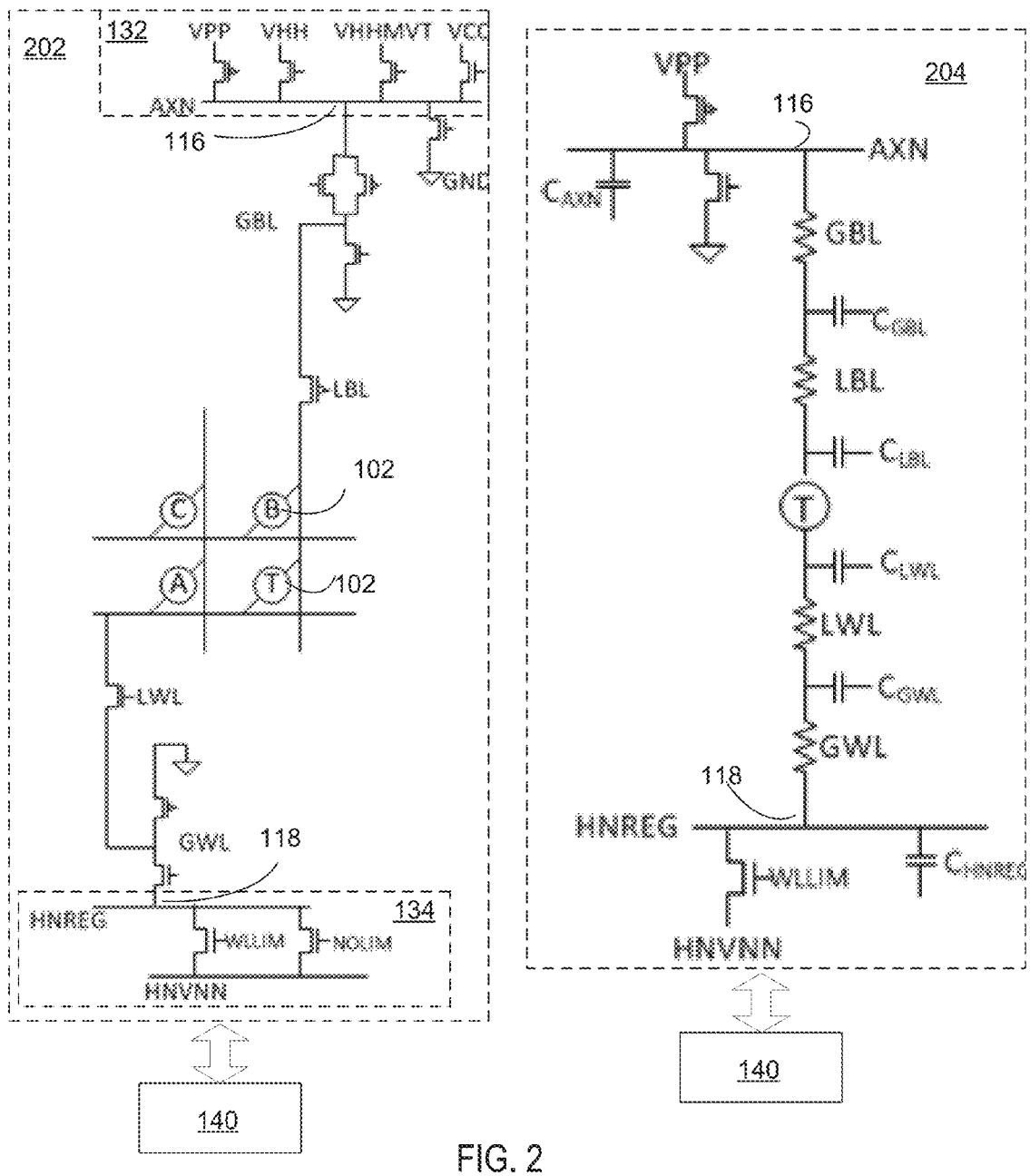
FIG. 2 is an example circuit diagram of an apparatus comprising an NVRAM device, such as PCM device, having the holding current provision technology of the present disclosure, in accordance with some embodiments.

FIG. 2 is an example circuit diagram of an apparatus comprising an NVRAM device having the holding current provision technology of the present disclosure, such as PCM device in accordance with some embodiments. More specifically, FIG. 2 illustrates an example portion 202 of the apparatus 100 in more detail, and a corresponding example circuit model 204 of the example portion 202 of the apparatus 100, in accordance with some embodiments. For simplicity of explanation, like elements of apparatus 100, example portion 202, and example circuit model 204 are indicated by like numerals. As shown, the example portion 202 may include at least a fragment of the cross-point memory array 150, including the cells 102, which may include a selected (e.g., target) cell T. The example portion 202 may further include bit line voltage supply sources VPP, VHH, VHHMVT, and VCC, comprising at least in part the bit line supply 132. The bit line node 116 is indicated by abbreviation AXN (referred to hereinafter as "AXN node"). It will be understood that the number and voltage levels of voltage supply sources may vary, depending on demands and configuration of the apparatus 100, and the voltage supply sources VPP, VHH, VHHMVT, and VCC are shown for illustrative purposes.

As shown, the example portion 202 may further include global word line driver GWL and local word line driver LWL, as well as global bit line driver GBL and local bit line driver LBL. The ground point of the bit line voltage supply 132 is indicated by abbreviation GND.

The example portion 202 may further include word line voltage supply source HNVNN at HNREG node, comprising at least in part the word line supply 134. As shown, word line supply 134 may include other components, such as limiting devices WLLIM (hereinafter WLLIM device) and NOLIM configured to control (e.g., limit) the current passing through the target cell T. In embodiments, WLLIM and NOLIM are devices that may be configured to control the current passing through the target cell T. There may only be one or both of the devices (e.g. WLLIM and/or NOLIM) or there may be more than 2 devices that are used to control the current.

The example circuit model 204 represents a simplified circuit diagram of the example portion 202 of the apparatus 100, in accordance with some embodiments. The like elements of the example circuit model 204 and the example portion 202 of the apparatus 100 are indicated by like numerals or abbreviations. As shown, GBL, LBL, GWL, and LWL are represented by their corresponding resistances and capacitances (e.g., GBL and CGBL respectively and the like). The AXN node 116 may have its own parasitic capacitance $C_{AXN}$ (e.g., about 1 pF). Similarly, the word line node 118 may have parasitic capacitance $C_{HNREG}$.

In some embodiments, the controller 140 may be configured to control the voltage supply circuitry 120 (e.g., its components 132 and 134) to create a SET pulse in a form of a passive ramp-down current profile over time using the parasitic capacitance $C_{AXN}$ of the AXN node 116. More specifically, the controller 140 may control voltage supply circuitry 120 to provide a current pulse that may keep a memory cell (e.g., T) in an on-state. The current pulse may comprise a profile that may change over time from a set point to the holding current level, in response to a discharge of the bit line node parasitic capacitance $C_{AXN}$ through the memory cell T after the set point is achieved.

More specifically, after selection of a target memory cell T, e.g., with a bit line supply voltage of a certain (first) level, the bit line voltage supply may increase to a different (second) level. At a certain point in time, the bit line voltage supply may be disabled, leaving the AXN node 116 "floating," and the bit line node capacitance $C_{AXN}$ may be discharged through the cell T to terminate the SET pulse. As the bit line node capacitance $C_{AXN}$ discharges, the voltage on the AXN node 116 may be reduced and the current may also reduce. Because the AXN node 116 is not being driven with a voltage supply, the voltage on the AXN node 116 may only be discharged through the cell T. The voltage at the AXN node 116 cannot increase, preventing a re-thresholding of the cell T during the ramp-down. Because no voltage supply is connected to the bit line side, the cell T may not threshold again. Current that passes through the memory cell may eventually reach the holding current level and the switching device of the cell T may turn the cell T off.

Accordingly, the current through the memory cell may be controlled to decrease from a specified set point down to about the holding current level of the switch device of the memory cell without allowing for the possibility of a re-thresholding event of the cell. When the bit line node capacitance $C_{AXN}$ is discharged, the bit line potential may decrease and become low enough, so that the memory cell T may not able to re-threshold.

To summarize, the described embodiments may enable control of the current passing through a target memory cell of the memory array 150 by modifying the SET current pulse (or, in some embodiments, a read current pulse) to achieve a lower SET VT after thresholding the memory cell. In general, the described embodiments may be used in conjunction with techniques that modify the current profile during the pulsing, to turn the memory cell off in a controlled fashion. The described embodiments may be used, for example, to terminate a read pulse and provide a set-back operation to the cell. In this case, if the cell thresholds during the read operation, the described embodiments may provide a ramp-down pulse down to the holding current of the cell, enabling the memory cell to remain at the same SET VT. The described embodiments may prevent a re-threshold of the memory cell during the termination of the pulse, to preserve the SET VT state of the memory cell that may be achieved with the current pulse being delivered to the memory cell.

Figure 3:
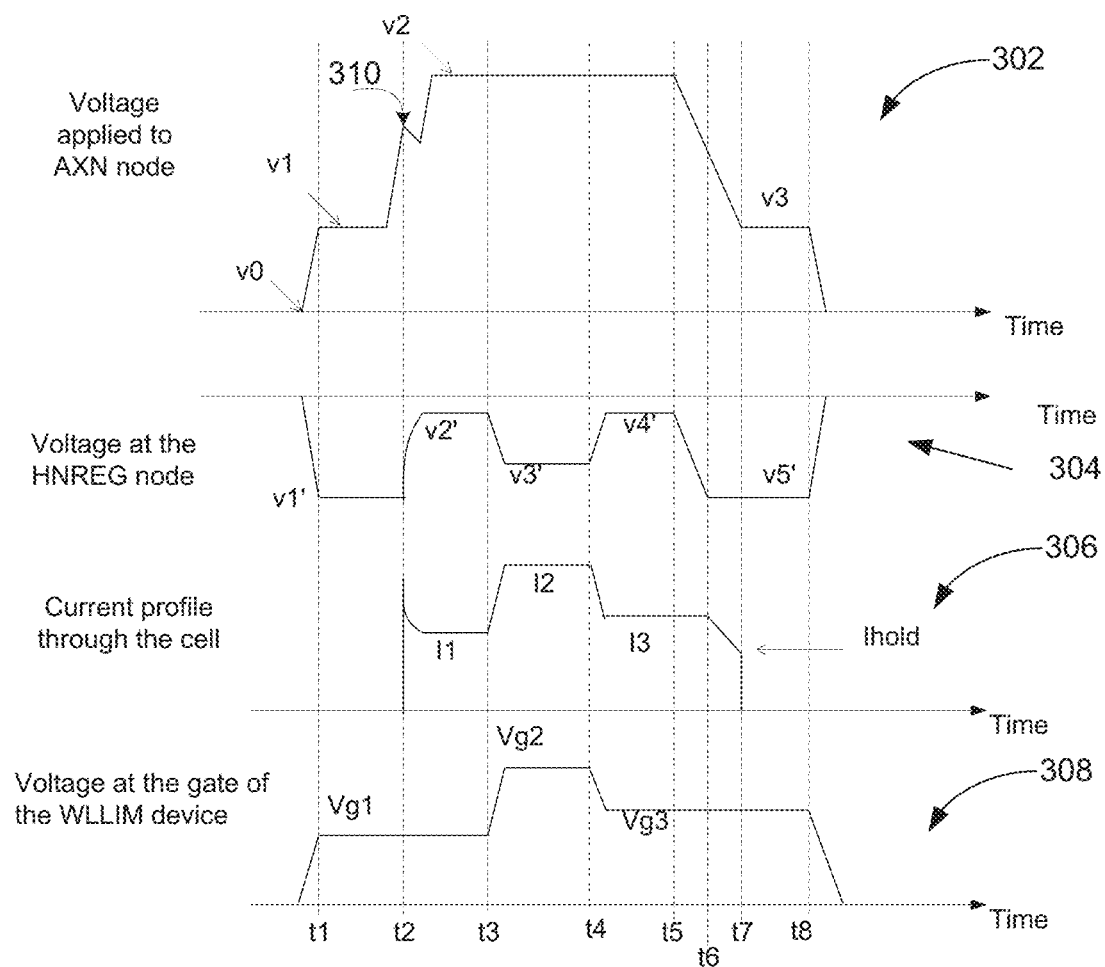
FIG. 3 is an example diagram illustrating voltage supply circuitry control of the apparatus of FIG. 1 to provide a current pulse to a memory cell, in accordance with some embodiments.

FIG. 3 is an example diagram illustrating voltage supply circuitry control of the apparatus 100 to provide a current pulse to a memory cell, to enable the memory cell to remain at substantially the same level of set threshold voltage without re-thresholding, in accordance with some embodiments. More specifically, the example diagram includes a graph 302 illustrating voltage applied to the bit line node (AXN node) as a function of time, a graph 304 illustrating voltage at the word line node (HNREG node) as a function of time, a graph 306 illustrating a current profile passing through the memory cell the as a function of time, and a graph 308 illustrating voltage at the gate of the limiting device (WLLIM device) as a function of time.

Before time instance t1, a memory cell may be selected, e.g., by providing a voltage of a selection level (e.g., "idle" or first voltage level v0, graph 302) to the memory cell. For example, the bit line decoders GBL and word line decoders GWL of the memory array 150 (FIGS. 1-2) may be turned on so as to select one specific cell in the array.

At time instance t1, AXN voltage may be ramped to level v1 (e.g., intermediary level, graph 302) and HNREG voltage may be ramped to v1's level (graph 304), e.g., in response to turning on the WLLIM device (graph 308).

At t2, AXN voltage may be ramped to level v2 (e.g., second level, graph 302), but during the ramp, the memory cell may snap (turn on), as indicated by numeral 310, and a current I1 above the holding current may begin to flow through the memory cell (current I1, graph 306).

The purpose of having intermediary voltage level v1 provided to the AXN node may be to decouple the ramp-up of voltage so that the ramp-up of voltage at the AXN node to the second level v2 may not be done in a single step. In more general terms, increasing the bit line voltage provided to the bit line node from an idle (first) level to a second level v2 may include increasing the bit line voltage from a first level to one or more intermediary levels, before increasing the bit line voltage to the second level. More specifically, the controller 140 may control the voltage supply circuitry 120 (FIG. 1) to increase the bit line voltage supply continuously or periodically, over a period of time, taking the bit line voltage supply level through multiple intermediary levels. For example, the controller 140 may control the voltage supply circuitry 120 to switch from voltage supply source VCC to voltage supply source VHHMVT to voltage supply source VHH to voltage supply source VPP (see FIG. 2).

Between t2 and t3, the voltage at AXN node may still be ramping to level v2 (graph 302). Current I1 may be flowing through the selected memory cell (current I1, graph 306), as determined by the gate voltage on the WLLIM device (Vg1, graph 308).

After t3, the gate voltage on the WLLIM device may be ramped to a second value (Vg2, graph 308) so as to modulate the current profile through the selected memory cell, to reach a set point (indicated by current I2, graph 306).

After t4, the gate voltage on the WLLIM device may be ramped to a second value (Vg3) so as to modulate the current profile through the memory cell.

In more general terms, one or more current steps (e.g. I1 and/or I2 and/or I3 or more than 3 currents) may be used during the first part of the current pulse.

After t5, AXN node may be "floated" (e.g., the bit line voltage supply may be disconnected from the AXN node as described above), and the AXN capacitance (CAXN, FIG. 2) may start to discharge through the memory cell, providing current I3, until t6, when the voltage available and path resistance causes the current to start reducing.

After t6, the current through the memory cell may be gradually reduced (graph 306), as a consequence of the floating AXN node (graph 302), at a rate that may be defined by the parasitic capacitance, the voltage available and the path resistance. The path resistance may be modulated so as to achieve a specific discharge rate while the AXN node is floated.

At t7, the current through the memory cell may reach the holding current value (Ihold) and become insufficient to sustain on-state, and the memory cell may turn off.

At t8, the provision of the current pulse to the memory cell may be terminated and the voltages may return to their idle states (graphs 302, 304, and 308).

Between times t5 and t8, the WLLIM device may be held at a fixed value, allowing charges to go through the WLLIM device, and thus limiting current (discharge rate of CAXN is limited). As shown, between times t6 and t7, even though the current Ihold is held constant (WLLIM gate is fixed between t6 and t7), the current Ihold may still decrease because the available voltage may not be sufficient to allow the current to increase or remain unchanged.

It should be noted that the WLLIM device may be used as described above to control current flowing through the memory cell, by draining charges from the AXN node at a controlled rate. The described process may also be implemented without manipulating the WLLIM device. For example, the WLLIM device may be set to a static level throughout time period t1-t8 (e.g., voltage at the gate of the WLLIM device may remain unchanged), and the current Ihold flowing through the memory cell and controlled by the voltage at AXN node as described above may prevent a re-threshold of the memory cell.

The time period from a moment in time about which the bit line voltage reaches the second level v2 to a moment in time about which the AXN node is left floating (e.g., voltage supply is disconnected from the AXN node), such as a time period from about t3 to t5, may be determined empirically (e.g., by testing one or more apparatuses 100) and programmed into the controller 140 of the apparatus 100. Alternatively, the time period may comprise the time between the memory cell turn-on and the floating of the AXN node, e.g., time period from t2 to t5. Similarly, this time period may be determined empirically and programmed into the controller 140, in order to disconnect the bit line voltage supply from the AXN node at a particular moment in time.

After another period of time following t8, the bit line voltage supply may be reconnected to the AXN node, to provide the bit line voltage at a particular, e.g., idle level.

It should be noted that the embodiments described herein refer to a scheme where the bit line node (AXN node) is floated. In other embodiments, the bit line and the word line configurations described above may have their roles interchanged. More specifically, the apparatus 100 (e.g., controller 140) may be configured to float the word line node (HNREG node). In this embodiment, a current limiting device (WLLIM device) may be used at the bit line node instead of the word line node as described above, to control current flowing through the memory cell. Accordingly, the controller may be configured to control voltage supply circuitry 120 (e.g., word line voltage supply 134) to provide a current pulse that keeps a memory cell in an on-state, wherein the current pulse comprises a profile that changes over time from a set point to the holding current level, in response to a discharge of the word line node parasitic capacitance through the memory cell after the set point is achieved.

Similarly to the above embodiments, the controller 140 may control the voltage supply circuitry 120 to provide a word line voltage at a first level to the word line node of the NVRAM device, to select the memory cell. In contrast to the above embodiments, the controller 140 may be configured to decrease the word line voltage provided to the word line node from the first level to a second level, to cause current to pass through the memory cell, to achieve the set point on-state of the memory cell, and, subsequent to the decrease of the word line voltage from the first level to the second level, disconnect voltage supply from the word line node, to cause the word line node parasitic capacitance $C_{HNREG}$ to discharge through the memory cell, and to cause the current passing through the memory cell to decrease over time, to reach the holding current that keeps the memory cell in the on-state.

Decreasing the word line voltage applied to the word line node from the first level to a second level may include, similar to the above-described embodiments, to control the circuitry 120 to decrease the word line voltage from a first level to one or more intermediary levels, before the decrease of the word line voltage to the second level, wherein the one or more intermediary levels are higher than the second level and lower than the first level. Decrease of the word line voltage from a first level to one or more intermediary levels may be conducted continuously or periodically, over a period of time. The controller 140 may further control the voltage supply circuitry 120 to disconnect voltage supply from the word line node after a predetermined time period from a moment in time when the word line voltage reaches the second level. In the described embodiment, the voltage supply circuitry 120 may include a bit line voltage supply coupled with the bit line node, to provide the bit line voltage to the bit line node, a word line voltage supply coupled with the word line node, to provide the word line voltage to the word line node, and a limiting device coupled with the bit line voltage supply, to control a current profile of the current passing through the memory cell after the word line voltage supply has been disconnected from the word line node.

Figure 4:
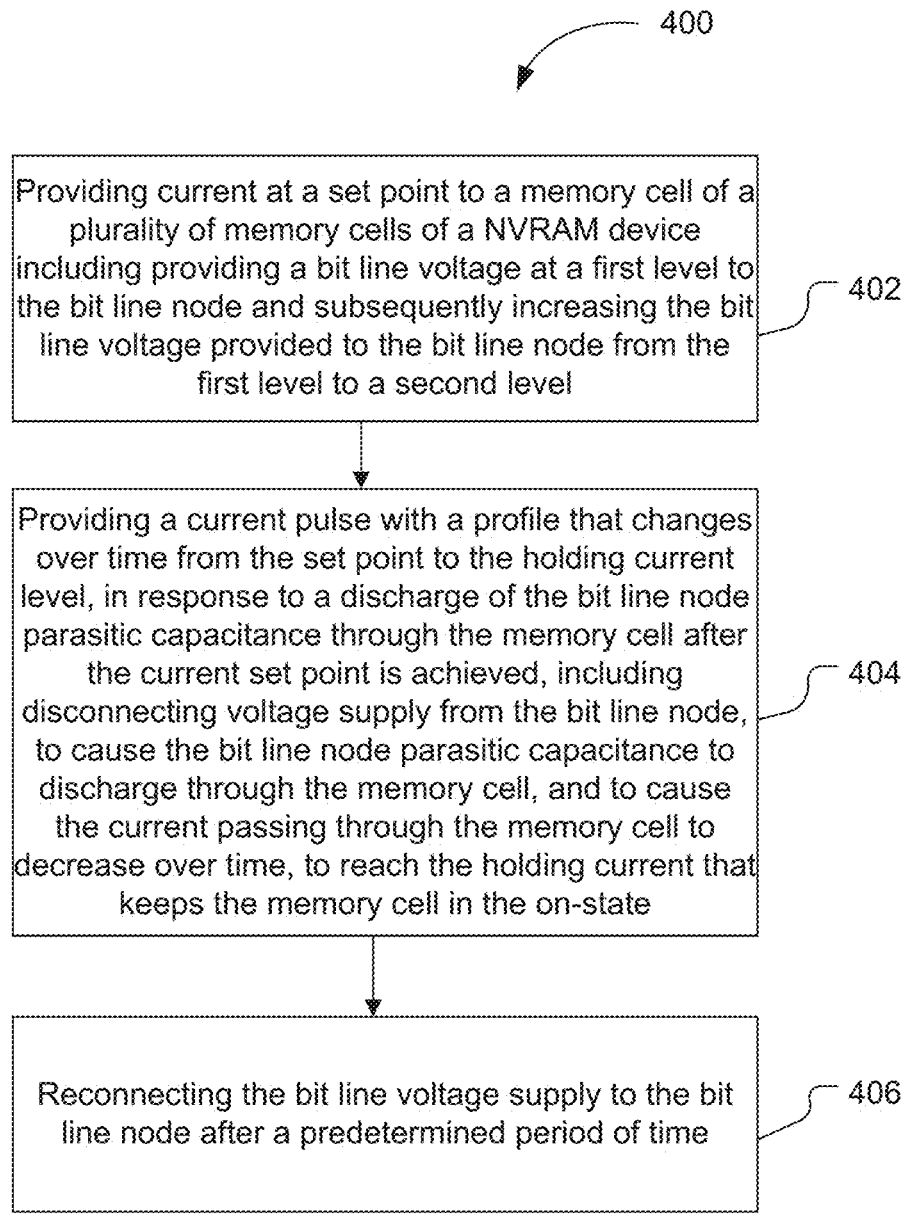
FIG. 4 is an example process flow diagram of a process 400 for performing a set operation of an NVRAM (e.g., PCM) device, in accordance with some embodiments.

FIG. 4 is an example process flow diagram of a process 400 for performing a set operation of an NVRAM (e.g., PCM) device, in accordance with some embodiments. The process 400 may comport with embodiments described in connection with FIGS. 1-3 and vice versa. The process may be performed, for example, by the controller 140 to control circuitry 120 of the apparatus 100 comprising a PCM device, as described in reference to FIGS. 1-3.

At block 402, the process 400 may include providing current at a set point to a memory cell of a plurality of memory cells of an NVRAM device, coupled to a plurality of bit lines forming a bit line node with parasitic capacitance.

The provision of the current at a set point may include providing a bit line voltage at a first level to the bit line node of the NVRAM device, to select a memory cell associated with the bit line. As described in reference to FIG. 3, the memory cell may be selected, e.g., by providing a bit line voltage at a first level (e.g., idle level) to the AXN node 116 (FIG. 2). For example, the apparatus 100 decoders may be enabled to pass the voltages applied to the AXN node 116 and HNREG node 118.

The provision of the current at a set point may further include increasing the bit line voltage provided to the bit line node from the first level to a second level, to cause current to pass through the memory cell, to achieve the set point on-state of the memory cell. As described in reference to FIG. 3, the WLLIM device may be enabled and the HNREG voltage may reach HNVNN level. As the AXN voltage is ramped-up, the memory cell may threshold and the current may be limited by the WLLIM device. The memory cell may reach its on-state.

Increasing the bit line voltage provided to the bit line node from the first level to a second level may include increasing the bit line voltage from a first level to one or more intermediary levels, before increasing the bit line voltage to the second level, wherein the one or more intermediary levels are lower than the second level and higher than the first level. For example, the controller may control the voltage supply circuitry to increase the bit line voltage from a first level to one or more intermediary levels continuously or periodically, over a period of time.

At block 404, the process 400 may include providing a current pulse with a profile that changes over time from the set point to the holding current level, in response to a discharge of the bit line node parasitic capacitance through the memory cell after the current set point is achieved. This action may include, subsequent to the increase of the bit line voltage from the first level to the second level, disconnecting voltage supply from the bit line node, to cause the bit line node parasitic capacitance to discharge through the memory cell, and to cause the current passing through the memory cell to decrease over time, to reach the holding current that keeps the memory cell in the on-state. The voltage disconnect may occur after a predetermined time period from a moment in time when the bit line voltage reaches the second level.

As described in reference to FIG. 3, the AXN node may be left "floating," e.g. all voltage sources may be disconnected from that node. The capacitance at the AXN node may discharge through the cell, sustaining the on-state of the memory cell until the current reaches a value at which the memory cell may turn off. Accordingly, the voltage at AXN node may be reduced passively over time and the cell may reach the lowest current that the on-state of the memory cell may support. The memory cell may eventually shut off, when it no longer sustains holding conditions. In embodiments, the WLLIM device may be configured to limit current passing through the memory cell during the ramp-down.

At block 406, the process 400 may include reconnecting the bit line voltage supply to the bit line node after another predetermined period of time. At that point, the bit line voltage supply may provide the bit line voltage at idle level.

The actions of the process 400 or other techniques described herein may be performed by any suitable module. For example, as noted above, one or more control modules (e.g., controller 140) may be coupled to control the apparatus 100 of FIG. 1 to perform the actions described herein. Accordingly, an article of manufacture is disclosed herein. In some embodiments, the article of manufacture may include a non-transitory computer-readable storage medium. The article of manufacture may have instructions stored thereon that, in response to execution by a processor, cause the actions described herein to be performed. Any suitable apparatus including, for example, a PCM device may be equipped with any suitable means (e.g., the one or more control modules and/or apparatus 100 of FIG. 1) configured to perform actions described herein.

Figure 5:
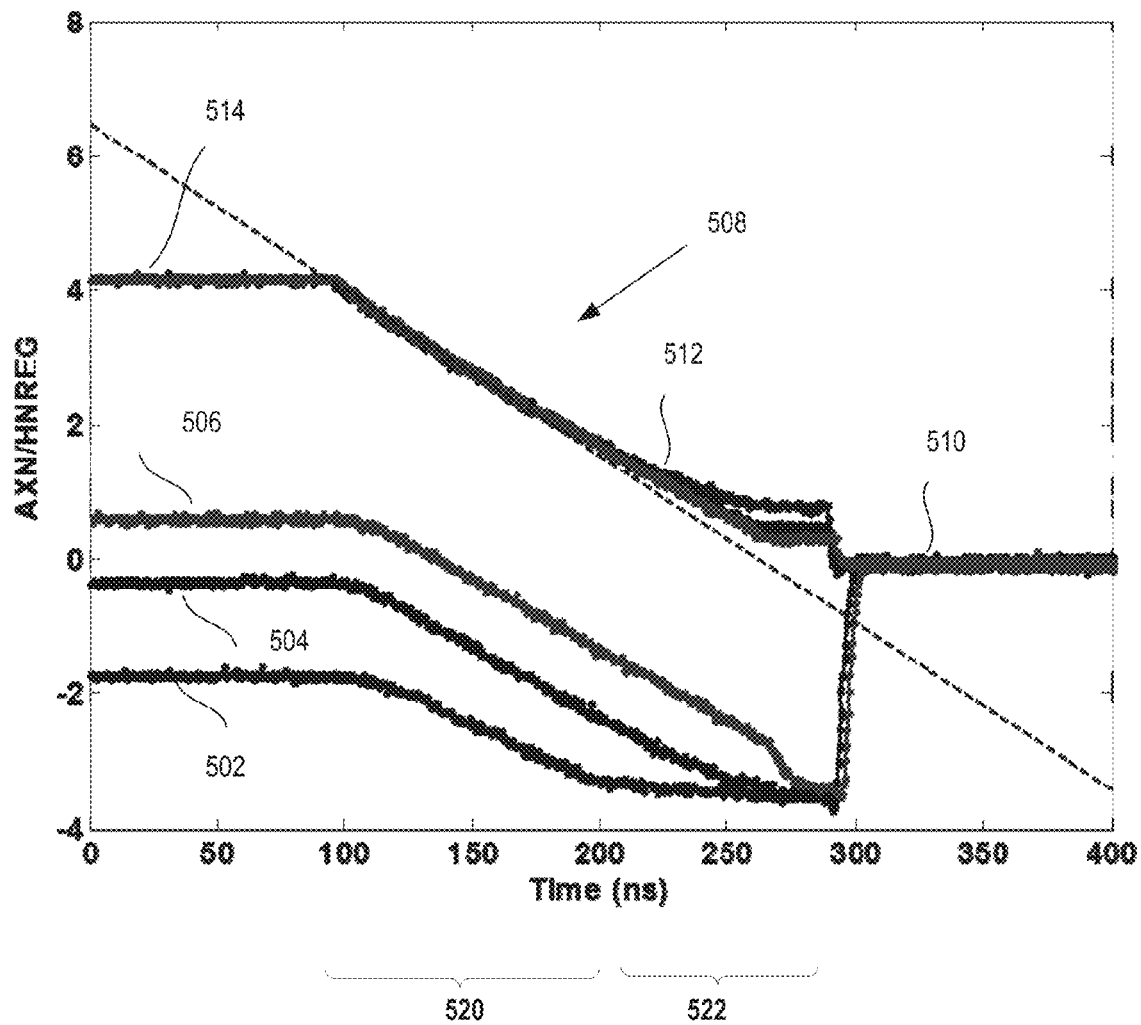
FIG. 5 is an example graph illustrating the ramp-down of bit line node voltage as a function of time after the bit line voltage supply is disconnected from the bit line node of the apparatus of FIG. 1, in accordance with some embodiments.

FIG. 5 is an example graph illustrating the ramp-down of bit line node voltage as a function of time after the bit line voltage supply is disconnected from the bit line node of the apparatus 100, in accordance with some embodiments. The example voltage ramp-down for three different memory cells located in different parts of the memory array of the apparatus 100 is shown. For example, graphs 502, 504 and 506 illustrate the voltage at HNREG node for three memory cells. Graph 508 comprising graphs 510 (lower curve), 512 (middle curve), and 514 (higher curve) illustrates the voltage at the AXN node for the same three memory cells. Graphs 506 and 510 illustrate the voltages for AXN and HNREG, respectively, for a cell that is located closest to AXN node and HNREG node with respect to the other two cells. Graph 504 and 512 illustrate the voltages for AXN node and HNREG node, respectively, for a cell that is located further away than the cell described by 506 and 510 from AXN node and HNREG node, but not further than the cell described by graph 502 and 514. Graphs 502 and 514 illustrate the voltages for AXN node and HNREG node, respectively, for a cell that is located further away from AXN node and HNREG node than the two other cells. As shown, the regime where the current is constant is in the area 520 (between approximately 100 ns and 200 ns) where the voltage loss at AXN node is linear in time. When the WLLIM device is no longer held in saturation the path resistance will cause the current to create a resistive voltage drop that is similar in magnitude to the voltage available between AXN node and HNREG node and the WLLIM device will transition from an operation in saturation region to linear region. This point corresponds to t6 in FIG. 3. At that point, the current gradually falls below the WLLIM saturation current, leading to the passive current ramp-down. The current then enters the regime indicated by numeral 522, where the charges accumulated in the parasitic capacitance are discharged through memory cell. During that time, the voltage at AXN node is reduced until the memory cell reaches its minimum sustainable on-state current and eventually shuts off.

Figure 6:
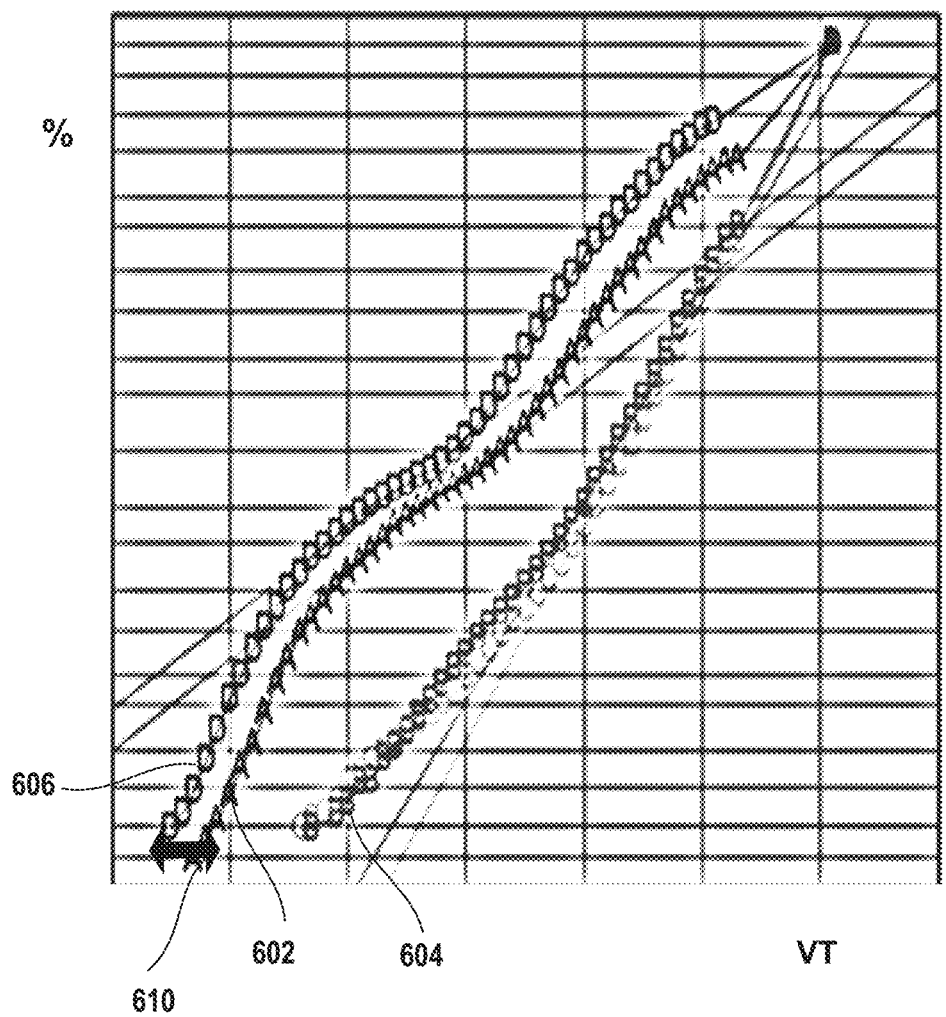
FIG. 6 is a graph illustrating example set state threshold voltage (SET VT) and reset state threshold voltage (RESET VT) distribution curves of the memory cell of the apparatus of FIG. 1, in accordance with some embodiments.

FIG. 6 is a graph illustrating example set state threshold voltage (SET VT) and reset state threshold voltage (RESET VT) distribution curves of the memory cell of the apparatus of FIG. 1, in accordance with some embodiments. More specifically, graph 602 illustrates a SET VT distribution curve in a case in which a standard current pulse is applied to a memory cell in a set operation. Graph 604 illustrates a RESET VT distribution curve. Graph 606 illustrates a SET VT distribution curve in a case in which a current pulse formed in accordance with embodiments described herein is applied to a memory cell in a set operation. The illustrated results show improvement in SET VT level when using the proposed method to achieve lowest on-state current for a SET pulse, vs. standard termination of a SET pulse. As shown, the threshold voltage window defined as the difference between the SET VT and RESET VT of the memory cell may increase by a difference indicated by numeral 610 (in some examples, from −500 mV to −800 mV) using the described approach.

Figure 7:
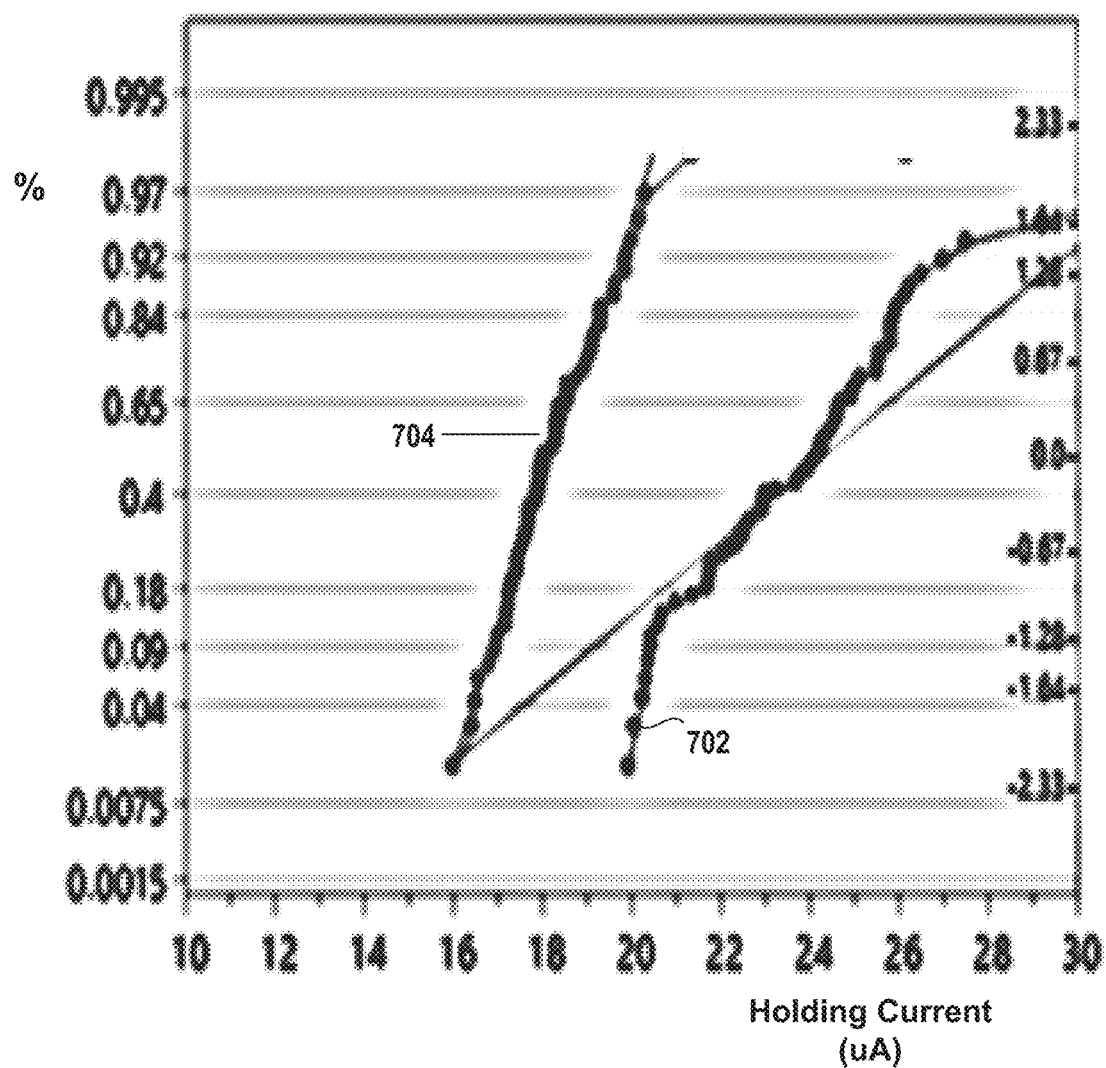
FIG. 7 is a graph illustrating holding current distribution for memory cells placed at different distances from a bit line node (AXN node) of the apparatus of FIG. 1, in accordance with some embodiments.

FIG. 7 is a graph illustrating holding current distribution for memory cells placed at different distances from a bit line node (AXN node) of the apparatus of FIG. 1, in accordance with some embodiments. Specifically, graph 702 illustrates a holding current distribution curve for a near memory cell, and graph 704 illustrates a holding current distribution curve for a far memory cell (e.g., a memory cell that is farther from AXN node than the memory cell associated with graph 702). As shown, the near memory cell holding current may have a higher value than the far memory cell holding current. Additionally, the near cell holding currents may have some intrinsic variations due to manufacturing imperfections. The current sweep provided according the embodiments described herein may allow a memory cell to meet its holding current, which may not be possible using conventional techniques (e.g., using a pre-determined current set point to terminate the current pulse).

Figure 8:
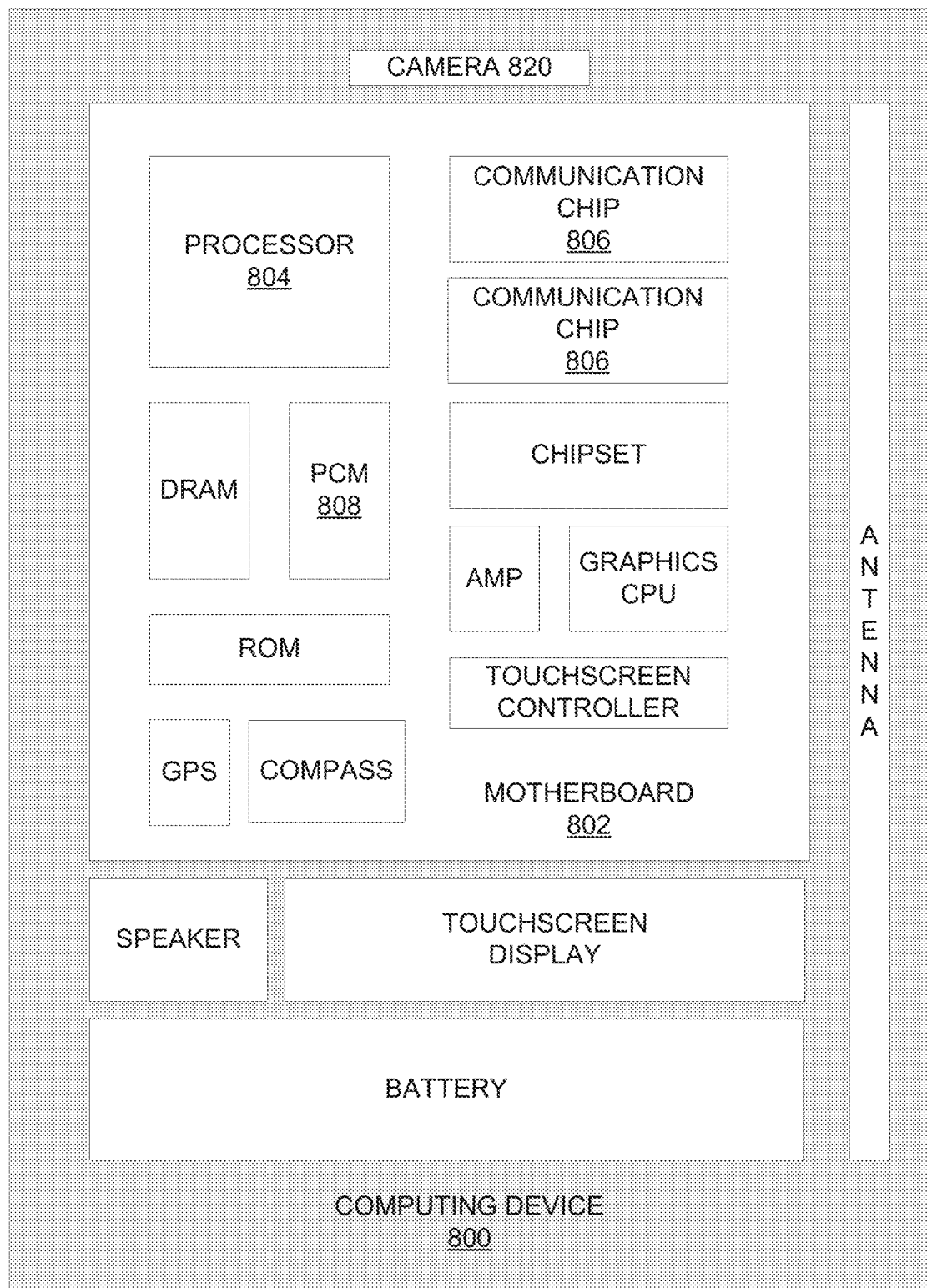
FIG. 8 is an example system that includes an NVRAM (e.g., PCM) device in accordance with various embodiments described herein.

Embodiments of the present disclosure may be implemented into a system using any suitable hardware and/or software to configure as desired. FIG. 8 schematically illustrates an example system (e.g., a computing device 800) that includes an NVRAM (e.g., PCM) device 808 having circuitry (e.g., controller 180 and voltage supply circuitry 120 of FIGS. 1-2) configured to perform actions in accordance with various embodiments described herein. The computing device 800 may house a board such as motherboard 802. The motherboard 802 may include a number of components, including but not limited to a processor 808 and at least one communication chip 806. The processor 804 may be physically and electrically coupled to the motherboard 802. In some implementations, the at least one communication chip 806 may also be physically and electrically coupled to the motherboard 802. In further implementations, the communication chip 808 may be part of the processor 804.

Depending on its applications, computing device 800 may include other components that may or may not be physically and electrically coupled to the motherboard 802. These other components may include, but are not limited to, a camera 820, volatile memory (e.g., DRAM), earlier described non-volatile memory (e.g., phase change memory (PCM) 808 or ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a mass storage device (such as hard disk drive, compact disk (CD), digital versatile disk (DVD), and so forth).

According to various embodiments, the PCM 808 may include circuitry (e.g., controller 140 and circuitry 120 of FIGS. 1-2) that is configured to perform actions (e.g., processes of FIG. 3 or 7) described herein. For example, the PCM 808 may be configured to perform provision of holding current to its memory cells as described herein.

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, EV-DO, and others.

In various implementations, the computing device 800 may be mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The following paragraphs describe examples of various embodiments.

Example 1 is an apparatus, comprising: a non-volatile random access memory (NVRAM) device including a plurality of memory cells coupled to a plurality of bit lines forming a bit line node with parasitic capacitance, wherein each memory cell comprises a switch device with a required level of a holding current to maintain an on-state of the memory cell; a voltage supply circuitry coupled with the NVRAM device; and a controller coupled with the voltage supply circuitry, wherein the controller is to control the voltage supply circuitry to provide a current pulse that keeps a memory cell in an on-state, wherein the current pulse comprises a profile that changes over time from a set point to the holding current level, in response to a discharge of the bit line node parasitic capacitance through the memory cell after the set point is achieved.

Example 2 may include the subject matter of Example 1, wherein the controller is to control the voltage supply circuitry to: provide a bit line voltage at a first level to the bit line node of the NVRAM device, to select the memory cell; increase the bit line voltage provided to the bit line node from the first level to a second level, to cause current to pass through the memory cell, to achieve the set point on-state of the memory cell; and subsequent to the increase of the bit line voltage from the first level to the second level, disconnect voltage supply from the bit line node, to cause the bit line node parasitic capacitance to discharge through the memory cell, and to cause the current passing through the memory cell to decrease over time, to reach the holding current that keeps the memory cell in the on-state.

Example 3 may include the subject matter of Example 1, wherein the controller is to control the circuitry to provide a word line voltage to a word line node of the NVRAM device, to select the memory cell.

Example 4 may include the subject matter of Example 3, wherein the memory cell is coupled with a word line of the NVRAM device, and with a bit line of the NVRAM device, wherein the memory cell is selectable through the word line and bit line associated with the word line node and the bit line node respectively.

Example 5 may include the subject matter of Example 1, wherein the controller to control the circuitry to increase the bit line voltage applied to the bit line node from the first level to a second level includes to control the circuitry to increase the bit line voltage from a first level to one or more intermediary levels, before the increase of the bit line voltage to the second level, wherein the one or more intermediary levels are lower than the second level and higher than the first level.

Example 6 may include the subject matter of Example 5, wherein the controller is to control the circuitry to increase the bit line voltage from a first level to one or more intermediary levels continuously or periodically, over a period of time.

Example 7 may include the subject matter of Example 1, wherein the controller to control the circuitry to disconnect voltage supply from the bit line node includes to control the circuitry to disconnect voltage supply after a predetermined time period from a moment in time when the bit line voltage reaches the second level.

Example 8 may include the subject matter of Example 7, wherein the NVRAM device is a PCM device, wherein the memory cell includes a phase change material, and wherein a portion of the current pulse that passes through the memory cell after the bit line voltage supply has been disconnected from the bit line node provides a crystalline state to the phase change material and keeps the phase change material from converting to an amorphous state at least for a period of time.

Example 9 may include the subject matter of Example 8, wherein the predetermined period of time corresponds to a time period during which the phase change material is at least partially crystallized.

Example 10 may include the subject matter of Example 9, wherein the control is to control the circuitry to reconnect the bit line voltage supply to the bit line node after another predetermined period of time, wherein the bit line voltage supply is to provide the bit line voltage at a third level.

Example 11 may include the subject matter of Example 3, wherein the voltage supply circuitry includes: a bit line voltage supply coupled with the bit line node, to provide the bit line voltage to the bit line node; a word line voltage supply coupled with the word line node, to provide the word line voltage to the word line node; and a limiting device coupled with the word line voltage supply, to control a current profile of the current passing through the memory cell after the bit line voltage supply has been disconnected from the bit line node.

Example 12 may include the subject matter of Example 1, wherein the NVRAM device comprises a cross-point memory array having the plurality of memory cells.

Example 13 may include the subject matter of any of Examples 1 to 12, wherein the apparatus is disposed on an integrated circuit.

Example 14 is a method comprising: providing current at a set point to a memory cell of a plurality of memory cells of a non-volatile random access memory (NVRAM) device, wherein the plurality of memory cells is coupled to a plurality of bit lines forming a bit line node with parasitic capacitance, each memory cell comprising a switch device with a required level of a holding current to maintain an on-state of the memory cell; and providing a current pulse with a profile that changes over time from the set point to the holding current level, in response to a discharge of the bit line node parasitic capacitance through the memory cell after the current set point is achieved.

Example 15 may include the subject matter of Example 14, further comprising: providing a bit line voltage at a first level to the bit line node of the NVRAM device, to select a memory cell associated with the bit line; increasing the bit line voltage provided to the bit line node from the first level to a second level, to cause current to pass through the memory cell, to achieve the set point on-state of the memory cell; and subsequent to the increase of the bit line voltage from the first level to the second level, disconnecting voltage supply from the bit line node, to cause the bit line node parasitic capacitance to discharge through the memory cell, and to cause the current passing through the memory cell to decrease over time, to reach the holding current that keeps the memory cell in the on-state.

Example 16 may include the subject matter of any of Examples 14 to 15, wherein increasing the bit line voltage provided to the bit line node from the first level to a second level includes increasing the bit line voltage from a first level to one or more intermediary levels, before increasing of the bit line voltage to the second level, wherein the one or more intermediary levels are lower than the second level and higher than the first level.

Example 17 may include the subject matter of Example 16, wherein disconnecting voltage supply from the bit line node includes disconnecting voltage supply after a predetermined time period from a moment in time when the bit line voltage reaches the second level.

Example 18 may include the subject matter of Example 17, further comprising: reconnecting the bit line voltage supply to the bit line node after another predetermined period of time, wherein the bit line voltage supply is to provide the bit line voltage at a third level.

Example 19 is a mobile device, comprising: a camera; a processor coupled with the camera; and a memory coupled with the processor and the camera, wherein the memory includes: a non-volatile random access memory (NVRAM) device including a plurality of memory cells coupled to a plurality of bit lines forming a bit line node with parasitic capacitance, wherein each memory cell comprises a switch device with a required level of a holding current to maintain an on-state of the memory cell; a voltage supply circuitry coupled with the NVRAM device; and a controller coupled with the voltage supply circuitry, wherein the controller is to control the voltage supply circuitry to provide a current pulse that keeps a memory cell in an on-state, wherein the current pulse comprises a profile that changes over time from a set point to the holding current level, in response to a discharge of the bit line node parasitic capacitance through the memory cell after the set point is achieved.

Example 20 may include the subject matter of Example 19, wherein the controller is to control the voltage supply circuitry to: provide a bit line voltage at a first level to the bit line node of the NVRAM device, to select the memory cell; increase the bit line voltage provided to the bit line node from the first level to a second level, to cause current to pass through the memory cell, to achieve the set point on-state of the memory cell; and subsequent to the increase of the bit line voltage from the first level to the second level, disconnect voltage supply from the bit line node, to cause the bit line node parasitic capacitance to discharge through the memory cell, and to cause the current passing through the memory cell to decrease over time, to reach the holding current that keeps the memory cell in the on-state.

Example 21 may include the subject matter of Example 20, wherein the controller to control the circuitry to increase the bit line voltage applied to the bit line node from the first level to a second level includes to control the circuitry to increase the bit line voltage from a first level to one or more intermediary levels, before the increase of the bit line voltage to the second level, wherein the one or more intermediary levels are lower than the second level and higher than the first level.

Example 22 may include the subject matter of Example 20, wherein the controller to control the circuitry to disconnect voltage supply from the bit line node includes to control the circuitry to disconnect voltage supply after a predetermined time period from a moment in time when the bit line voltage reaches the second level.

Example 23 is a method comprising: providing current at a set point to a memory cell of a plurality of memory cells of a non-volatile random access memory (NVRAM) device, wherein the plurality of memory cells is coupled to a plurality of word lines forming a word line node with parasitic capacitance, each memory cell comprising a switch device with a required level of a holding current to maintain an on-state of the memory cell; and providing a current pulse with a profile that changes over time from the set point to the holding current level, in response to a discharge of the word line node parasitic capacitance through the memory cell after the current set point is achieved.

Example 24 may include the subject matter of Example 23, further comprising: providing a word line voltage at a first level to the word line node of the NVRAM device, to select a memory cell associated with the word line; decreasing the word line voltage provided to the word line node from the first level to a second level, to cause current to pass through the memory cell, to achieve the set point on-state of the memory cell; and subsequent to the decrease of the word line voltage from the first level to the second level, disconnecting voltage supply from the word line node, to cause the word line node parasitic capacitance to discharge through the memory cell, and to cause the current passing through the memory cell to decrease over time, to reach the holding current that keeps the memory cell in the on-state.

Example 25 may include the subject matter of Example 24, wherein decreasing the word line voltage provided to the word line node from the first level to a second level includes decreasing the word line voltage from a first level to one or more intermediary levels, before decreasing of the word line voltage to the second level, wherein the one or more intermediary levels are higher than the second level and lower than the first level.

Methods, apparatuses, systems, and devices for performing the above-described techniques are illustrative examples of embodiments disclosed herein. Additionally, other devices in the above-described interactions may be configured to perform various disclosed techniques.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

What is claimed is:

1. A method comprising:
providing current to a memory cell of a plurality of memory cells of a non-volatile random access memory (NVRAM) device, wherein the plurality of memory cells is coupled to a plurality of bit lines forming a bit line node with parasitic capacitance, each memory cell comprising a switch device that requires a level of a holding current to maintain an on-state of the memory cell, wherein providing current includes providing a bit line voltage at a first level to the bit line node, to select the memory cell; and increasing the bit line voltage provided to the bit line node from the first level to a second level, to cause the current to pass through the memory cell, to achieve a set point of the memory cell; and
providing a current pulse with a profile that changes over time from the set point to the holding current level, in response to a discharge of the bit line node parasitic capacitance through the memory cell after the current set point is achieved, including, subsequent to the increase of the bit line voltage from the first level to the second level, disconnecting voltage supply from the bit line node, to cause the bit line node parasitic capacitance to discharge through the memory cell, and to cause the current passing through the memory cell to decrease over time, to reach the holding current level that keeps the memory cell in the on-state.

2. The method of claim 1, wherein increasing the bit line voltage provided to the bit line node from the first level to the second level includes increasing the bit line voltage from the first level to one or more intermediary levels, before increasing of the bit line voltage to the second level, wherein the one or more intermediary levels are lower than the second level and higher than the first level.

3. The method of claim 2, wherein disconnecting voltage supply from the bit line node includes disconnecting voltage supply after a predetermined time period from a moment in time when the bit line voltage reaches the second level.

4. The method of claim 3, wherein increasing the bit line voltage from the first level to the one or more intermediary levels includes increasing the bit line voltage continuously or periodically, over a period of time.

5. The method of claim 3, further comprising:
reconnecting the bit line voltage supply to the bit line node after another predetermined period of time, wherein the bit line voltage supply is to provide the bit line voltage at a third level.

6. The method of claim 3, wherein the memory cell is coupled with a word line of the NVRAM device, and with a bit line of the NVRAM device, wherein the method further comprises selecting the memory cell through the word line and the bit line associated with a word line node and the bit line node respectively.

7. The method of claim 1, wherein the NVRAM device is a PCM device, wherein the memory cell includes a phase change material, and wherein a portion of the current pulse that passes through the memory cell after the bit line voltage supply has been disconnected from the bit line node provides a crystalline state to the phase change material and keeps the phase change material from converting to an amorphous state at least for a period of time.

8. The method of claim 1, wherein the NVRAM device comprises a cross-point memory array having the plurality of memory cells.

9. The method of claim 8, wherein the cross-point memory array is disposed on an integrated circuit.

10. A method comprising:
providing current to a memory cell of a plurality of memory cells of a non-volatile random access memory (NVRAM) device, wherein the plurality of memory cells is coupled to a plurality of word lines forming a word line node with parasitic capacitance, each memory cell comprising a switch device that requires a level of a holding current to maintain an on-state of the memory cell, wherein providing current includes providing a word line voltage at a first level to the word line node of the NVRAM device, to select a memory cell associated with the word line; and decreasing the word line voltage provided to the word line node from the first level to a second level, to cause current to pass through the memory cell, to achieve a set point on-state of the memory cell; and
providing a current pulse with a profile that changes over time from the set point to the holding current level, in response to a discharge of the word line node parasitic capacitance through the memory cell after the current set point is achieved, including subsequent to the decrease of the word line voltage from the first level to the second level, disconnecting voltage supply from the word line node, to cause the word line node parasitic capacitance to discharge through the memory cell, and to cause the current passing through the memory cell to decrease over time, to reach the holding current that keeps the memory cell in the on-state.

11. The method of claim 10, wherein decreasing the word line voltage provided to the word line node from the first level to the second level includes decreasing the word line voltage from the first level to one or more intermediary levels, before decreasing the word line voltage to the second level, wherein the one or more intermediary levels are higher than the second level and lower than the first level.

12. The method of claim 11, wherein disconnecting voltage supply from the word line node includes disconnecting voltage supply after a predetermined time period from a moment in time when the word line voltage reaches the second level.

13. The method of claim 10, wherein the NVRAM device is a PCM device, wherein the memory cell includes a phase change material, and wherein a portion of the current pulse that passes through the memory cell after the word line voltage supply has been disconnected from the word line node provides a crystalline state to the phase change material and keeps the phase change material from converting to an amorphous state at least for a period of time.

14. The method of claim 10, wherein the NVRAM device comprises a cross-point memory array having the plurality of memory cells.

15. The method of claim 14, wherein the cross-point memory array is disposed on an integrated circuit.

* * * * *